(12) United States Patent
Huang et al.

(10) Patent No.: US 9,198,303 B2
(45) Date of Patent: *Nov. 24, 2015

(54) MANUFACTURING METHOD FOR MULTI-LAYER CIRCUIT BOARD

(71) Applicant: Unimicron Technology Corp., Taoyuan (TW)

(72) Inventors: Pei-Chang Huang, Taoyuan County (TW); Cheng-Po Yu, Taoyuan County (TW); Han-Pei Huang, Taoyuan County (TW); Ai-Hwa Lim, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 72 days.

This patent is subject to a terminal disclaimer.

(21) Appl. No.: 14/073,869

(22) Filed: Nov. 7, 2013

(65) Prior Publication Data
US 2015/0121693 A1      May 7, 2015

(51) Int. Cl.
| | |
|---|---|
| *B05D 5/12* | (2006.01) |
| *H05K 3/40* | (2006.01) |
| *H05K 3/46* | (2006.01) |
| *H05K 1/02* | (2006.01) |
| *B05D 7/00* | (2006.01) |
| *C23C 18/16* | (2006.01) |
| *H05K 1/11* | (2006.01) |
| *H05K 3/24* | (2006.01) |
| *H05K 3/12* | (2006.01) |

(52) U.S. Cl.
CPC ............... *H05K 3/4038* (2013.01); *B05D 7/50* (2013.01); *C23C 18/1655* (2013.01); *H05K 1/0298* (2013.01); *H05K 3/46* (2013.01); *H05K 3/4644* (2013.01); *B05D 5/12* (2013.01); *H05K 1/111* (2013.01); *H05K 3/12* (2013.01); *H05K 3/244* (2013.01); *H05K 2203/107* (2013.01)

(58) Field of Classification Search
USPC ........................................ 427/97.1, 97.2, 97.7
See application file for complete search history.

(56) References Cited

U.S. PATENT DOCUMENTS

| 2002/0182958 A1* | 12/2002 | Tani et al. ..................... 442/180 |
| 2005/0224767 A1* | 10/2005 | Japp et al. ..................... 252/570 |

FOREIGN PATENT DOCUMENTS

| TW | 484350 | 4/2002 |
| TW | I341161 | 4/2011 |

* cited by examiner

*Primary Examiner* — Brian K Talbot
(74) *Attorney, Agent, or Firm* — Jianq Chyun IP Office

(57) ABSTRACT

A manufacturing method for a multi-layer circuit board includes the following steps. Firstly, two core layers are compressed to form a substrate having two surfaces opposite to each other. Then, a via connecting the surfaces is formed. A patterned circuit layer including a concentric-circle pattern is then formed on each surface by using the via as an alignment target. Next, a first stacking layer is formed on each surface. Then, a first through hole penetrating regions of the first stacking layer and the substrate where a first concentric circle from the center of the concentric-circle pattern is orthogonally projected thereon is formed. A second stacking layer is then formed on each first stacking layer. Afterward, a second through hole penetrating regions of the first, the second stacking layers and the substrate where a second concentric circle from the center of the concentric-circle pattern is orthogonally projected thereon is formed.

16 Claims, 9 Drawing Sheets

MANUFACTURING METHOD FOR MULTI-LAYER CIRCUIT BOARD

BACKGROUND OF THE INVENTION

1. Field of the Invention

The invention relates to a manufacturing method for a circuit board, and particularly relates to a manufacturing method for a multi-layer circuit board.

2. Description of Related Art

As the integration of electronic products is increasingly improved, a circuit layer of a circuit board applied to the high-integration electronic products increases from single layer, double layer to 6 layers, 8 layers and even more than 10 layers, so as to mount more electronic components on a printed circuit board. Generally speaking, the most common manufacturing process for a circuit board is the lamination process. When the lamination process is used to manufacture the circuit board, an alignment accuracy between each circuit layer and insulating layer needs to be appropriately controlled. Therefore, in the manufacturing process of the circuit board, a plurality of alignment targets are usually formed in a previous stacking layer through a photolithography process. Then, after another layer is added, X ray is used to find the alignment targets of the previous layer, and a milling process is performed to form alignment targets for a subsequent process.

However, since the alignment targets in the previous stacking layer are formed through the photolithography process, the process itself already causes errors. When the milling process using X ray is performed, additional errors in the milling process also occur. Thus, alignment errors caused by the alignment targets of each layer continuously accumulate. If a number of circuit layers of the circuit board increases, the accumulated errors of the alignment targets also increase, resulting in an overly large deviation of an interlayer alignment accuracy that makes a design of conductive holes and bonding pads on bottom layers unable to be miniaturized.

SUMMARY OF THE INVENTION

The invention provides a manufacturing method for a multi-layer circuit board capable of improving an interlayer alignment accuracy of the multi-layer circuit board, increasing a wiring density and capability of a circuit layer, making it possible that conductive holes and bonding pads on bottom layers are designed to be miniaturized owing to the alignment accuracy. Even a pattern design with a single-side alignment accuracy up to less than 50 µm may be achieved.

The invention provides a manufacturing method for a multi-layer circuit board, which includes the following steps. Firstly, two core layers are compressed to form a substrate. The substrate has two surfaces opposite to each other. Then, a first via connecting through the surfaces is formed. Then, a first patterned circuit layer is formed on each of the two surfaces by using the first via as an alignment target. Each of the first patterned circuit layer includes a first concentric-circle pattern surrounding the first via. Next, a first stacking layer is formed on each of the two surfaces, and the first stacking layer includes a first dielectric layer and a first circuit layer covering the first dielectric layer. Then, a first through hole penetrating regions where an inner diameter of a first concentric circle from a center of the first concentric-circle pattern is orthogonally projected on the first stacking layer and the substrate is formed. Next, a second stacking layer is formed on each of the first stacking layers. Each of the second stacking layer includes a second dielectric layer and a second circuit layer covering the second dielectric layer. Afterward, a second through hole penetrating regions where an inner diameter of a second concentric circle from the center of the concentric-circle pattern is orthogonally projected on the second stacking layers, the first stacking layers and the substrate is formed.

Based on above, in the manufacturing method for the multi-layer circuit board, two core layers are compressed to form a substrate; then the concentric-circle pattern at the innermost is used as the alignment target in each of the stacking layers to form the corresponding alignment through hole; and the alignment through hole of each layer is used to perform the subsequent process of the corresponding stacking layer. Moreover, after layers of the substrate are repeatedly added to achieve certain structural strength, the two core layers of the substrate can be separated from each other to form two individual multi-layer circuit boards, and the subsequent process of adding layers can be performed to the two individual multi-layer circuit boards. Therefore, the manufacturing method of the invention is capable of forming two individual multi-layer circuit boards, reducing accumulation of alignment error through layers in conventional multi-layer circuit board, and even reducing layer deviation in the conventional multi-layer circuit board. Therefore, the invention can indeed increase the wiring density and capability of the circuit layer. In addition, the design of the conductive holes and the bonding pads on bottom layers can be miniaturized owing to the alignment accuracy. Even a pattern design with a single-side alignment accuracy up to less than 50 µm may be achieved.

To make the above features and advantages of the disclosure more comprehensible, several embodiments accompanied with drawings are described in detail as follows.

DESCRIPTION OF THE EMBODIMENTS

Figure 1A:
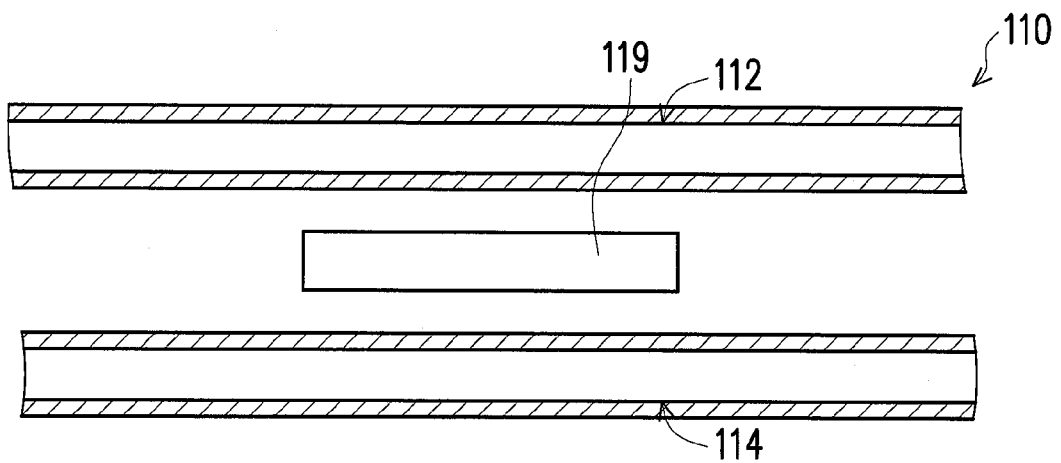
FIGS. 1A to 1N are schematic views illustrating a process flow of a manufacturing method for a multi-layer circuit board according to an embodiment of the invention.
Figure 1B:
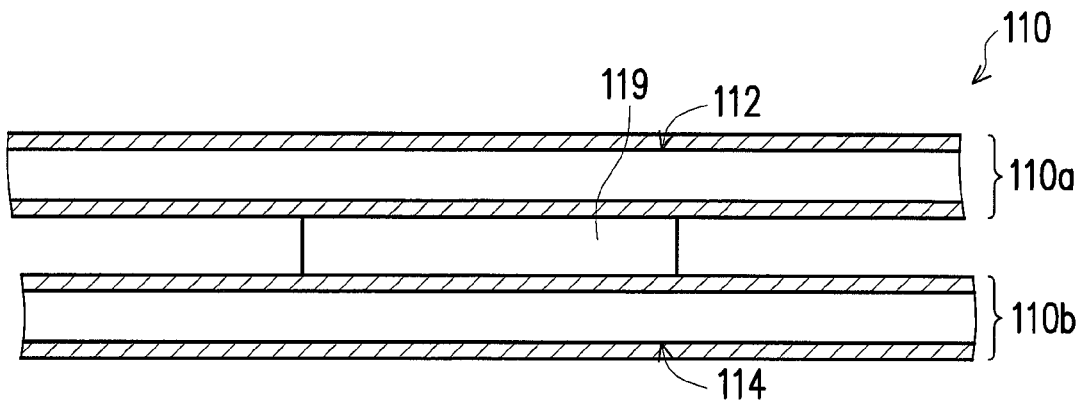
Figure 1C:
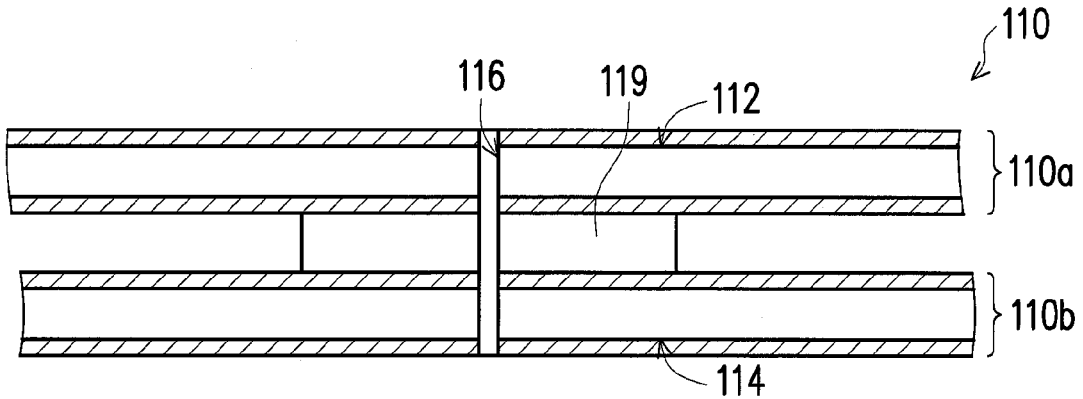
Figure 1D:
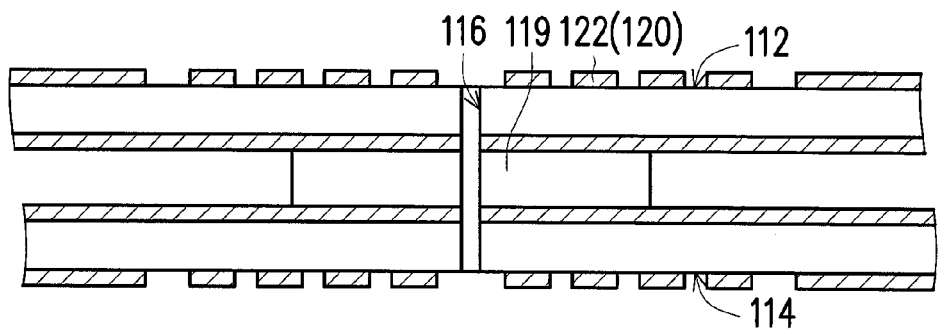
Figure 1E:
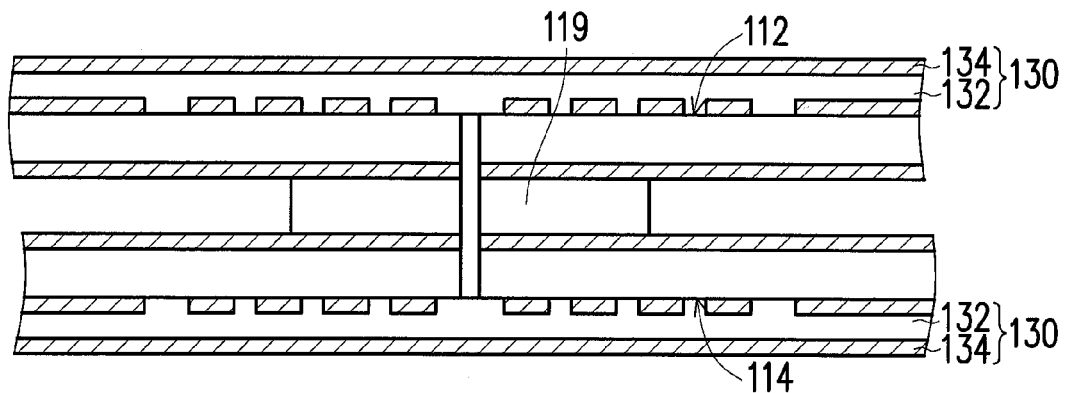
Figure 1F:
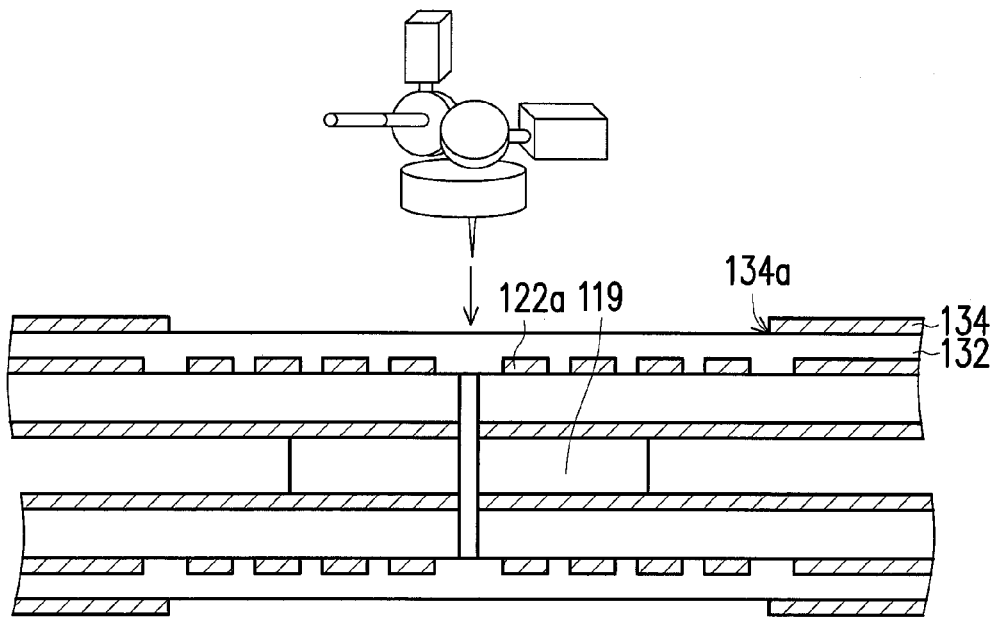
Figure 1G:
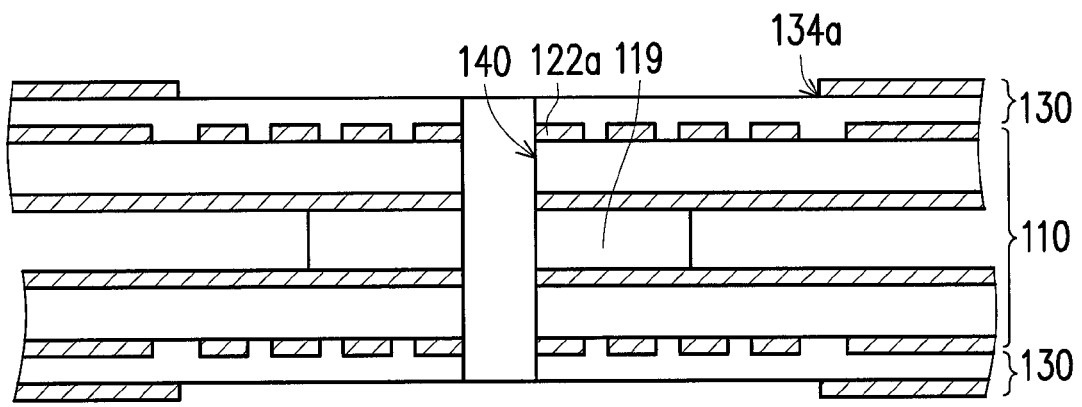
Figure 1H:
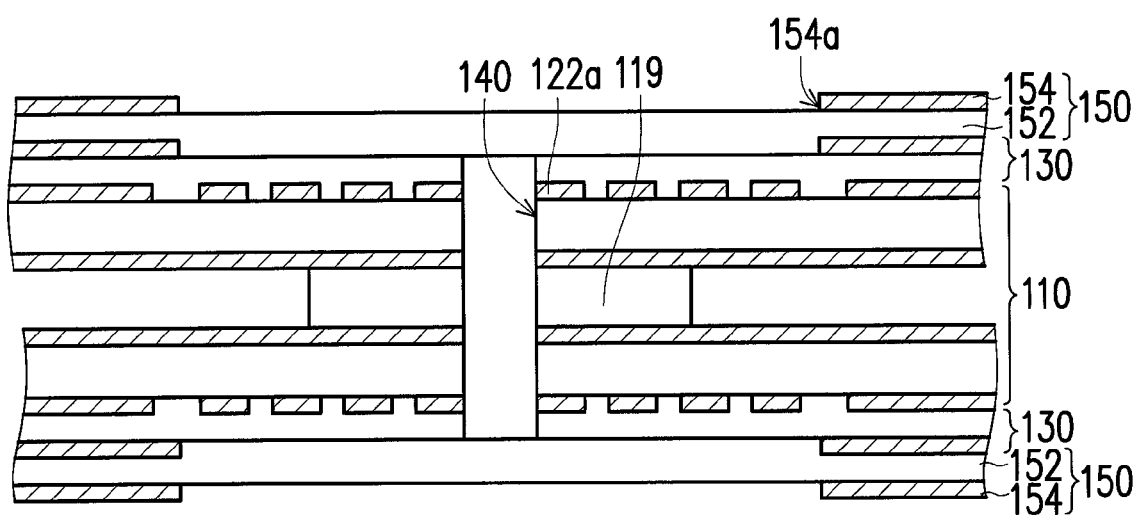
Figure 1I:
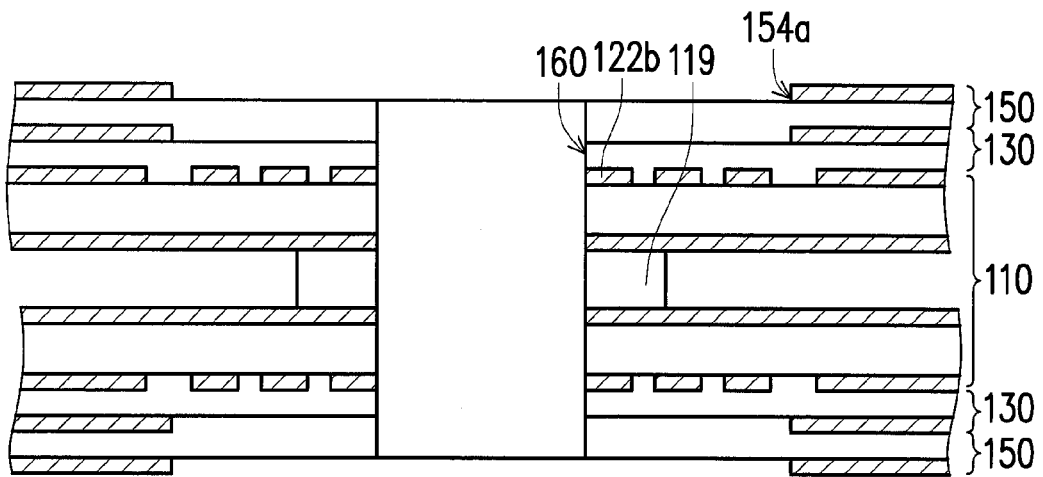
Figure 1J:
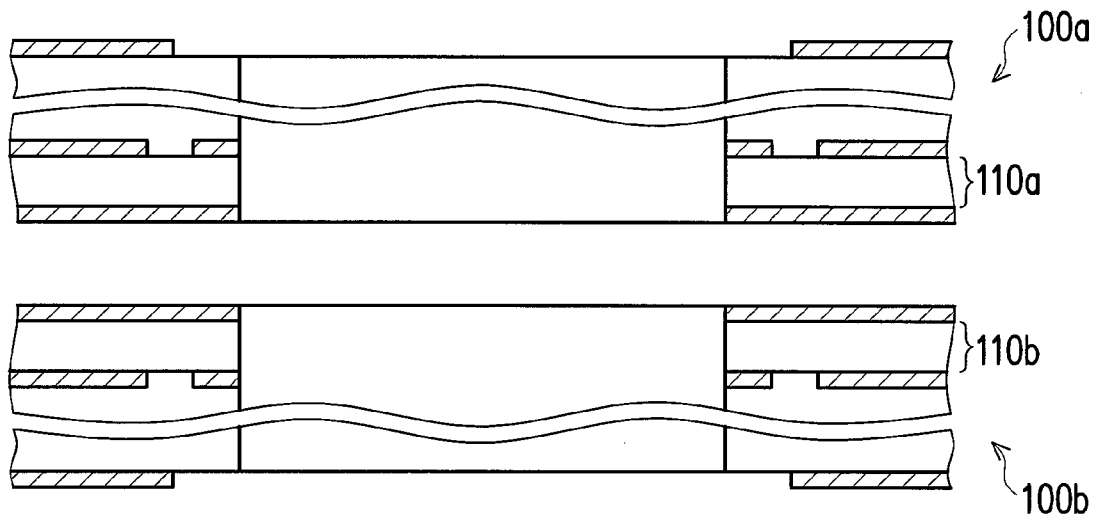
Figure 1K:
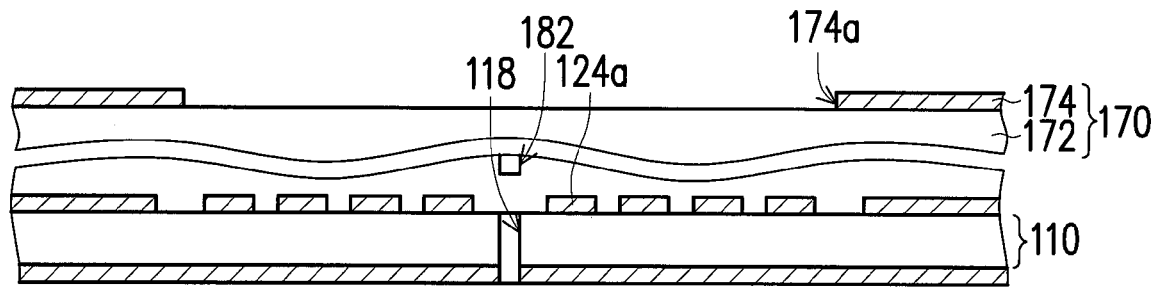
Figure 1L:
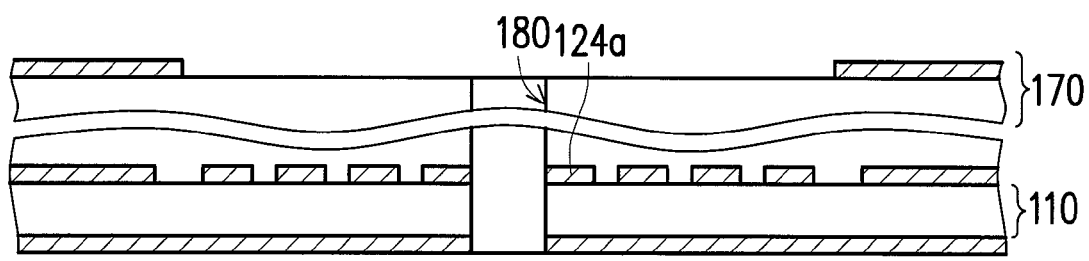
Figure 1M:
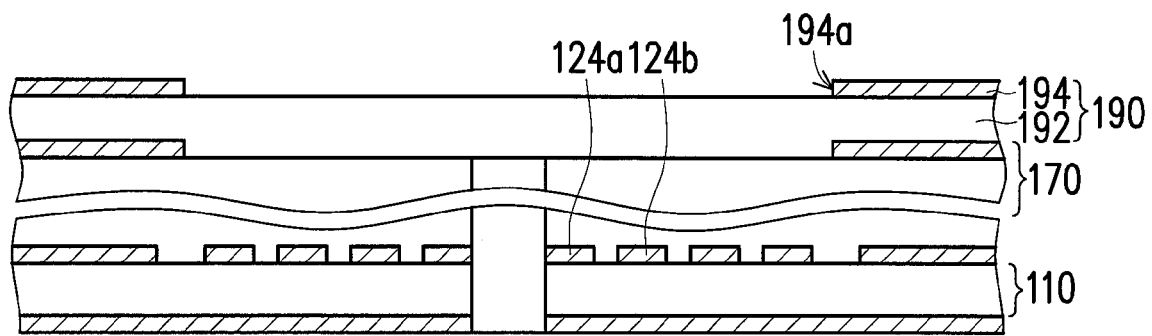
Figure 1N:
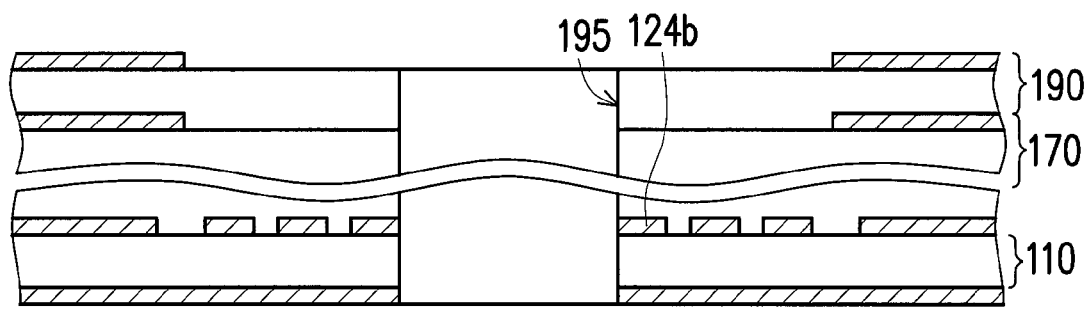
Figure 2:
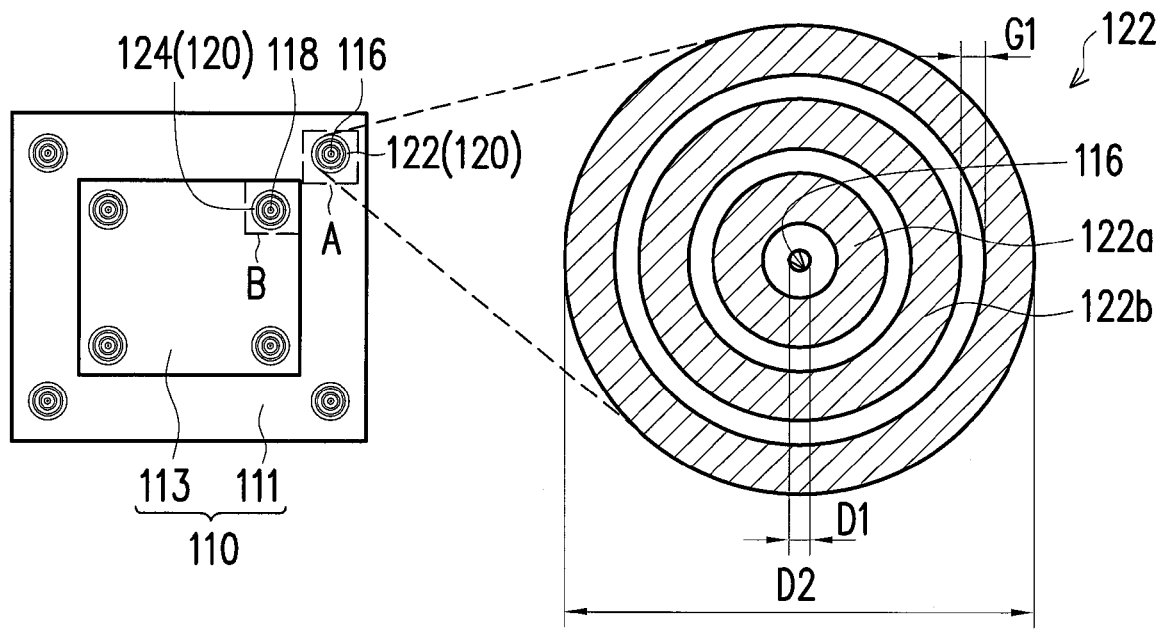
FIG. 2 illustrates a schematic top view of a substrate and a first pattern circuit layer of FIG. 1D, and a partially enlarged view of a region A thereof.

FIGS. 1A to 1N are schematic views illustrating a process flow of a manufacturing method for a multi-layer circuit board according to an embodiment of the invention. FIG. 2 illustrates a schematic top view of a substrate and a first pattern circuit layer of FIG. 1D, and a partially enlarged view of a region A thereof. It should be noted that, a manufacturing process illustrated in FIG. 1A to FIG. 1J are cross-sectional views of a manufacturing process of the region A of FIG. 2. In the present embodiment, the manufacturing method for the multi-layer circuit board includes the following. First, referring to FIG. 1A and FIG. 1B together, two core layers 110a and 110b are compressed to form a substrate 110. As shown in FIG. 1B, the substrate 110 includes two surfaces 112 and 114 opposite to each other. In the present embodiment, each of the core layers 110a and 110b has a thickness being approximately less than 50 μm. Next, as shown in FIG. 1C, a first via 116 is formed, and the first via 116 penetrates the substrate 110.

In the present embodiment, a method of compressing the two core layers 110a and 110b includes, for example, compressing a bonding material 119 in between the two core layers 110a and 110b, so as to bond the two core layers 110a and 110b to form the substrate 110. A material of the bonding material 119 is, for example, resin, and the first via 116 respectively penetrates the substrate 110 and the bonding material 119. It should be noted that, the first via 116 is formed on a junction where the core layers 110a and 110b are bonded by the bonding material 119, so as to prevent a gas tight status between the two core layers 110a and 110b from being destroyed by the first via 116, or prevent fluid in a wet process from leaking in between the two core layers 110a and 110b through the first via 116. In the present embodiment, an outer diameter of the first via 116 substantially ranges between 0.5 mm and 0.8 mm.

Referring to FIG. 1D and FIG. 2 together, next, metal layers on two surfaces 112 and 114 are patterned by using the first via 116 as an alignment target, so as to form a first patterned circuit layer 120 on each of the surfaces 112 and 114. In the present embodiment, as shown in FIG. 2, an outer diameter D1 of the first via 116 substantially ranges between 0.5 mm and 0.8 mm. As shown in FIG. 2, the first patterned circuit layer 120 includes a first concentric-circle pattern 122 surrounding the first via 116. The first concentric-circle pattern 122 includes a plurality of concentric circles, and a gap G1 between each of the concentric circles substantially ranges between 50 μm and 100 μm. Of course, the invention is not limited thereto. Persons skilled in the art may make adjustments according to design and layout requirements of actual product.

Figure 3:
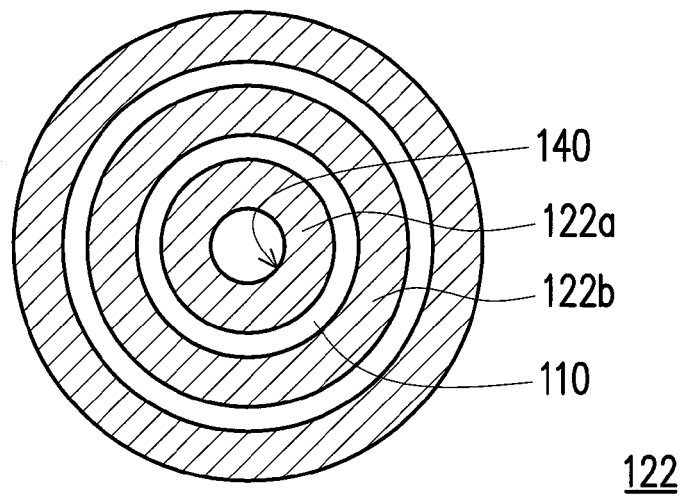
FIG. 3 is a schematic top view of the first concentric-circle pattern of FIG. 1G.

Next, as shown in FIG. 1E, a first stacking layer 130 is formed on each of the two surface 112 and 114. Therein, the first stacking layer 130 includes a first dielectric layer 132 and a first circuit layer 134, and the first circuit 134 covers the first dielectric layer 132. Thereafter, referring to FIG. 1F and FIG. 1G together, a first through hole 140 is formed by using $CO_2$ laser drilling, for example. As shown in FIG. 1G, the first through hole 140 penetrates regions where an inner diameter of a first concentric circle 122a from a center of the first concentric-circle pattern 122 is orthogonally projected on the first stacking layers 130 and the substrate 110. FIG. 3 is a schematic top view of the first concentric-circle pattern 122 penetrated by the first through hole 140.

In the present embodiment, a material of the first patterned circuit layer 120 and the first circuit layer 134 is copper. Since copper only has a higher absorption rate in a short wavelength range with a wavelength shorter than the ultraviolet wavelength range (<0.3 μm), and the wavelength of $CO_2$ laser is longer (approximately longer than 10 μm), belonging to the infrared wavelength range, the $CO_2$ laser is less likely to be absorbed by copper and causes a hole due to ablation. Therefore, the concentric-circle pattern 122 made of copper may be considered as a copper mask for $CO_2$ laser, configured to limit a cutting range of $CO_2$ laser to the first stacking layer 130 and the substrate 110. Namely, when using $CO_2$ laser to drill outwardly from the center, the first through hole 140 is formed by drilling with the inner diameter of the first concentric circle 122a as a boundary. It should be noted that when $CO_2$ laser is used to form the first through hole 140, a first opening 134a as shown in FIG. 1F needs to be formed on the first circuit layer 134 first, such that the first opening 134a can expose a region where the first concentric-circle pattern 122 is orthogonally projected on the first dielectric layer 132 before proceeding to the subsequent drilling process.

Naturally, the invention is not limited thereto. In other embodiments of the invention, direct laser drilling (DLD) may also be used to form the first through hole 140. If the direct laser drilling is used to form the first through hole 140, it is not necessary to form the first opening 134a as shown in FIG. 1F. Instead, the laser drilling may be directly performed to form the first through hole 140. In the present embodiment, the first through hole 140 may be formed by simultaneously drilling from outer surfaces of the first stacking layers 130 at two sides of the substrate 110 towards the substrate 110, for example.

Next, the first through hole 140 may serve as an alignment target to perform a subsequent process to the first stacking layer 130. For example, the first through hole 140 may serve as an alignment target in a photolithography process to pattern the first circuit layer 134, so as to form a second patterned circuit layer of the multi-layer circuit board. Or, the first through hole 140 may serve as an alignment target to form a first conductive hole on the first stacking layer 130.

Figure 4:
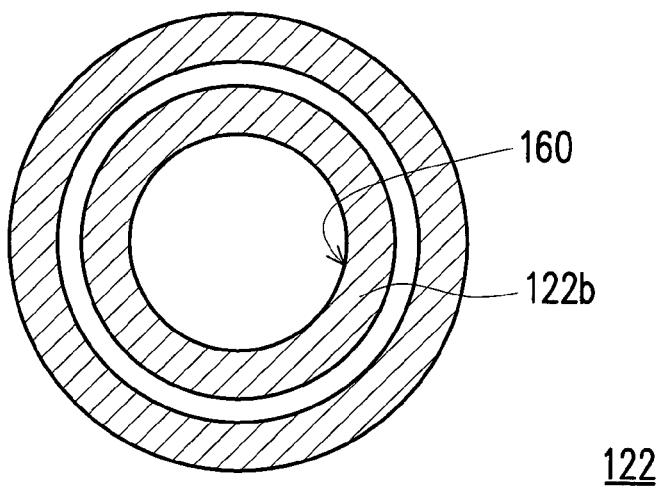
FIG. 4 is a schematic top view of the first concentric-circle pattern of FIG. 1I.

Next, as shown in FIG. 1H, a second stacking layer 150 is formed on each of the first stacking layers 130. Each of the second stacking layers 150 includes a second dielectric layer 152 and a second circuit layer 154, and the second circuit 154 covers the second dielectric layer 152. Afterwards, as shown in FIG. 1I, a second through hole 160 is formed, and the second through hole 160 penetrates regions where an inner diameter of a second concentric circle 122b from the center of the first concentric-circle pattern 122 is orthogonally projected on the second stacking layers 150, the first stacking layers 130 and the substrate 110. FIG. 4 illustrates a schematic top view of the first concentric-circle pattern 122 penetrated by the second through hole 160.

Similar to formation of the first through hole, the second through hole 160 may also be formed by the $CO_2$ laser drilling. Namely, by using $CO_2$ laser to drill outwardly from the center and remove a portion of the substrate 110 between the first concentric circle 122a and the second concentric circle 122b, as shown in FIG. 3, the first concentric circle 122a may be stripped from the concentric-circle pattern 122 to form the second through hole 160 as shown in FIG. 4. Similarly, in case $CO_2$ laser is used to form the second through hole 160, a second opening 154a as shown in FIG. 1H needs to be formed first, such that the second opening 154a can expose a region where the first concentric-circle pattern 122 is orthogonally projected on the second dielectric layer 152 before proceeding to the subsequent drilling process.

Naturally, in other embodiments of the invention, the direct laser drilling (DLD) may also be used to form the second through hole 160. In this way, it is not necessary to form the second opening 154a as shown in FIG. 1H. Instead, the direct laser drilling may be directly performed to form the second through hole 160. In the present embodiment, the second through hole 160 may be formed by simultaneously drilling from outer surfaces of the second stacking layers 150 at the two sides of the substrate 110 towards the substrate 110.

Next, the second through hole 160 may serve as an alignment target to perform a subsequent process to the second stacking layer 150. For example, the second through hole 160 may serve as an alignment target in a photolithography process to pattern the second circuit layer 154, so as to form a third patterned circuit layer of the multi-layer circuit board. Or, the second through hole 160 may serve as an alignment target to form a second conductive hole on the second stacking layer 150. Therein, the second conductive hole connects the first conductive hole on the first stacking layer 130.

Naturally, numbers of stacking layers, circuit layers, and concentric circles of the concentric-circle pattern are not particularly limited in the invention. Person skilled in the art may follow the manufacturing method described above to continue stack additional stacking layers on the second stacking layer, use the concentric-circle pattern 122 as an alignment target to form an alignment through hole of each layer, and perform a subsequent alignment process with the alignment through hole of each layer, so as to form a patterned circuit layer and/or a conductive hole of each layer.

In case a number of times of adding layers for the multi-layer circuit board exceeds a predetermined value (e.g., equal to or more than five) such that a certain structural strength is reached, and a substrate separation can then be performed. Namely, after layers of the substrate 110 are repeatedly added to achieve the certain structural strength, the two core layers 110a and 110b of the substrate 110 can be separated from each other, as shown in FIG. 1J, so as to form two individual multi-layer circuit boards 100a and 100b. Afterwards, subsequent process of adding layers may then be performed to the multi-layer circuit boards 100a and 100b. In the present embodiment, since an image-capturing window of a charge-coupled device (CCD) in a production equipment is limited by a maximum readable size, a maximum outer diameter D2 of the first concentric-circle pattern 122 is substantially less than or equal to 3.175 mm. Thereby, another concentric-circle pattern may be used as the alignment target in the alignment process for a stacking layer formed thereafter.

Figure 5:
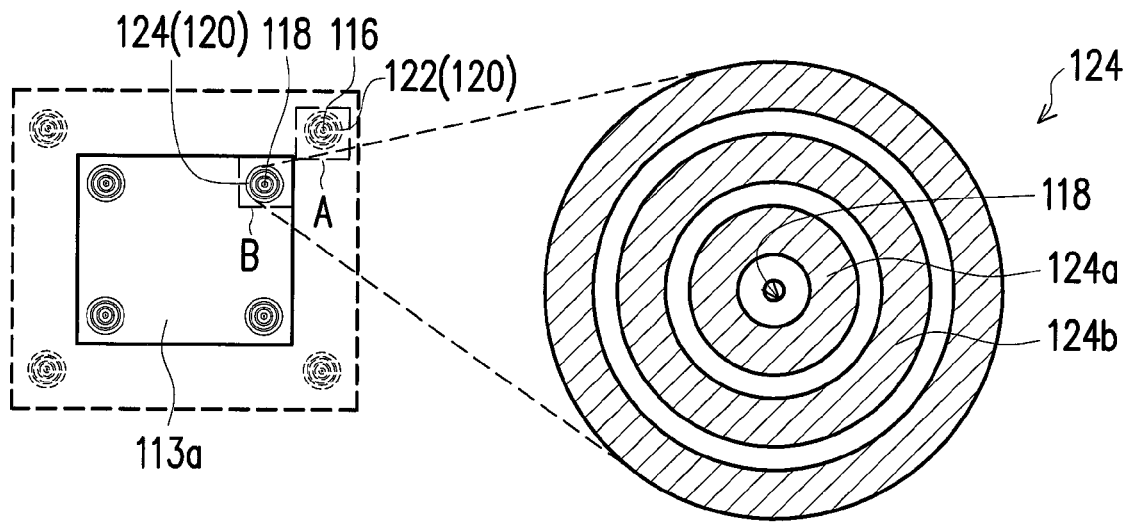
FIG. 5 illustrates a schematic top view of a substrate and a first pattern circuit layer of FIG. 1D, and a partially enlarged view of a region B thereof.

Accordingly, the first patterned circuit layer 120 requires two concentric-circle patterns 122 and 124 respectively depicted in FIG. 2 and FIG. 5, and besides the first via 116, the substrate 110 may further include a second via 118 penetrating the substrate 110. Next, as shown in FIG. 2 and FIG. 5, the first via 116 and the second via 118 are used as the alignment targets, so that the first patterned circuit layer 120 may be respectively formed on the surfaces 112 and 144. Besides the first concentric-circle pattern 122 surrounding the first via 116 as shown in FIG. 2, each of the first patterned circuit layers 120 also includes the second concentric-circle pattern 124 surrounding the second via 118 as shown in FIG. 5. In the present embodiment, the substrate 110 can include a peripheral region 111 and a core region 113. Therein, the peripheral region 113 surrounds and connects the core region 113, and the first via 116 and the second via 118 are disposed in the peripheral region 111 and core region 113, respectively. Accordingly, after certain structural strength is reached by using the first concentric-circle pattern 122 as the alignment target in the process of adding layers, the substrate separation can then be performed. Then, the peripheral region 111 of the substrate 110 can be removed to form a core-region substrate 113a as shown in FIG. 5. Next, the subsequent process of adding layers can be performed to the core-region substrate 113a by using the second concentric-circle pattern 124 as an alignment target.

Since the first concentric-circle pattern 122 and the second concentric-circle pattern 124 are formed by using the same patterning process, thus accumulation of alignment error caused by a plurality of patterning processes can be prevented. Accordingly, the stacking layers formed on the multi-layer circuit boards 100a and 100b after the substrate separation can all use the second concentric-circle pattern 124 as an alignment target for the subsequent alignment process, and a manufacturing process thereof can refer to FIG. 1K to FIG. 1N. It should be noted that, a multi-layer circuit board 100a (after the substrate separation is performed) is used as an example in the manufacturing process depicted in FIG. 1K to FIG. 1N, which are also cross-sectional views of a manufacturing process of the region B of FIG. 5.

Referring to FIG. 1K, in case the number of times of adding layers for the multi-layer circuit board exceeds the predetermined value (e.g., greater than M times, and M is a positive integer greater than 2), certain structural strength is reached, and a $M^{th}$ stacking layer can be stacked above the second stacking layer 150, as shown in FIG. 1K. In the present embodiment, M is, for example, six. Namely, before the substrate separation is performed to the multi-layer circuit board, a first to a fifth stacking layers have been formed by using the first concentric-circle pattern 122 as an alignment target, and a sixth stacking layer 172 (i.e., the $M^{th}$ stacking layer) includes a sixth dielectric layer 172 and a sixth circuit layer 174 covering the sixth dielectric layer 172. Afterwards, as shown in FIG. 5 and FIG. 1L, a sixth through hole 180 is formed, which penetrates regions where an inner diameter of a first concentric circle 124a from the center of the second concentric-circle pattern 124 is orthogonally projected on the first to the sixth stacking layers of the multi-layer circuit board 100a and the substrate 110.

It should be noted that, while the through holes of each of the dielectric layers (e.g., the first to the fifth stacking layer) are formed by using the first concentric-circle pattern 122 as the alignment target, blind holes 182 can be formed on a position where the second via 118 of the second concentric-circle pattern 124 is orthogonally projected on the corresponding dielectric layer. Namely, the blind holes 182 are respectively formed on each of the dielectric layers (e.g., the first to the fifth stacking layer) corresponding to the second via 118. Therein, an outer diameter of the blind hole 182 is less an inner diameter of the first concentric circle 124a. Accordingly, since each of the stacking layers has already formed with the blind holes to reduce a total thickness of the dielectric layer, in the subsequent process, when it comes to form the sixth through hole 180, it is not required for the laser to burn through the dielectric layers with a thicker total thickness at once.

Next, the sixth through hole 180 may serve as an alignment target to perform a subsequent process to the sixth stacking layer 170. For example, the sixth through hole 180 may serve as an alignment target in a photolithography process to pattern the sixth circuit layer 174, so as to form a patterned circuit layer of the multi-layer circuit board. Or, the sixth through hole 180 may serve as an alignment target to form a sixth conductive hole on the sixth stacking layer 170.

Referring to FIG. 1M, a seventh stacking layer 190 (i.e., a $(M+1)^{th}$ stacking layer) is formed on the sixth stacking layer 170. The seventh stacking layer 190 includes a seventh dielectric layer 192 and a seventh circuit layer 194 covering the seventh dielectric layer 194. Afterwards, as shown in FIG. 5 and FIG. 1N, a seventh through hole 195 is formed, which penetrates regions where an inner diameter of a second concentric circle 124b from the center of the second concentric-circle pattern 124 is orthogonally projected on the first to the seventh stacking layers and the substrate 110.

Next, the seventh through hole 195 may serve as an alignment target to perform a subsequent process to the seventh stacking layer 190. For example, the seventh through hole 195 may serve as an alignment target in a photolithography process to pattern the seventh circuit layer 194, so as to form a patterned circuit layer of the multi-layer circuit board. Or, the seventh through hole 195 may serve as an alignment target to form a seventh conductive hole on the seventh stacking layer 190. Therein, the seventh conductive hole connects the sixth conductive hole on the sixth stacking layer 170, and the conductive holes of each layer are connected to each other to conduct each of the stacking layers in the multi-layer circuit board.

As described above, the sixth through hole 180 and the seventh through hole 195 may also be formed by the $CO_2$ laser drilling or the direct laser drilling. Similarly, in case $CO_2$ laser is used to form the sixth through hole 180 and the seventh through hole 190, openings 174a and 194a as shown in FIG. 6A and FIG. 6C need to be formed first, so as to respectively expose regions where the second concentric-circle pattern 124 is orthogonally projected on of the sixth dielectric layer 172 and the seventh dielectric layer 192 before proceeding to the subsequent drilling process. In case the direct laser drilling is used, the direct laser drilling may be directly performed without forming the openings 174a and 194a.

Figure 6:
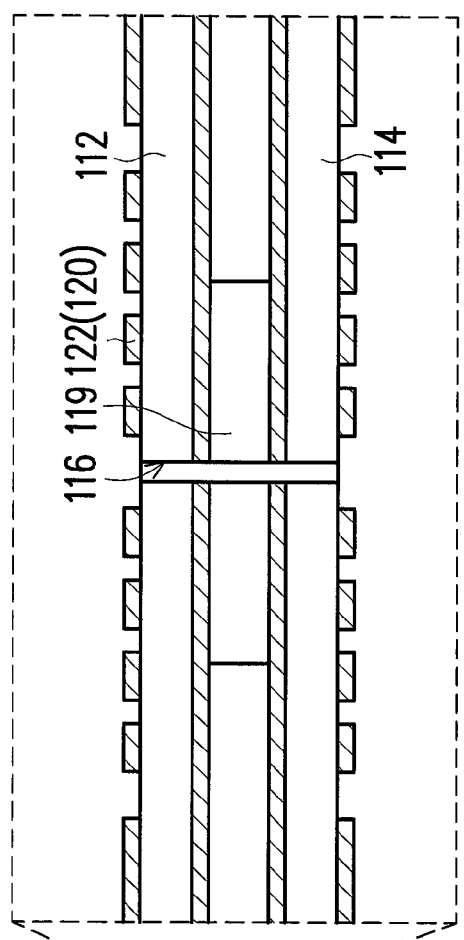
FIG. 6 illustrates a cross-sectional view of the multi-layer circuit board, and a partially enlarged schematic view thereof.
Figure 6:
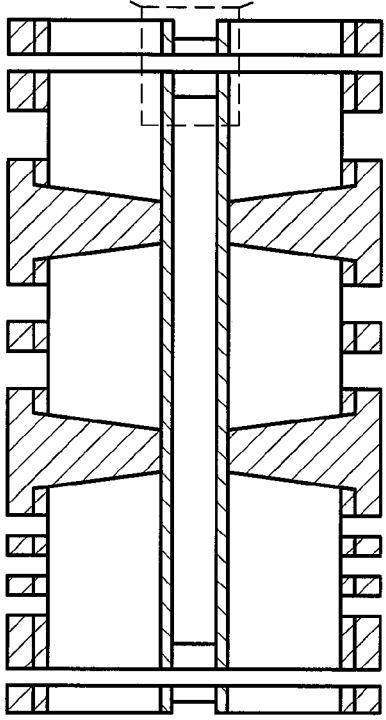

FIG. 6 illustrates a cross-sectional view of the multi-layer circuit board, and a partially enlarged schematic view thereof. Referring to FIG. 6, it should be noted that, in the multi-layer circuit board of the present embodiment, the bonding material 119 is disposed at periphery regions of the two core layers 110a and 110b for bonding the two core layers 110a and 110b to form a sealed region at the periphery regions of the two core layers 110a and 110b, such that the two core regions 110a and 110b can be temporarily boned together to prevent agents used in subsequent process from leaking in between the core layers 110a and 110b. The first concentric-circle pattern 122 and the second concentric-circle pattern (the second concentric-circle pattern 124 as shown in FIG. 2) can be disposed in corresponding the bonding material 119, such that the first via 116 can be formed in the sealed region as shown in FIG. 6, or formed in a region between the sealed region and an outer border of the multi-layer circuit board, so as to prevent a gas tight status between the two core layers 110a and 110b from being destroyed by the first via 116, or prevent fluid in the process from leaking in between the two core layers 110a and 110b through the first via 116.

In view of above, in the manufacturing method for the multi-layer circuit board, the two core layers are compressed to form a substrate; then the concentric-circle pattern at the innermost is used as the alignment target in each of the stacking layers to form the corresponding alignment through hole; and the alignment through hole of each layer is used to perform the subsequent process of the corresponding stacking layer, such as using the alignment through hole as the reference for alignment to form the patterned circuit layer and the conductive hole of each layer. Moreover, after layers of the substrate is repeatedly added to achieve certain structural strength, the two core layers of the substrate can be separated from each other to form two individual multi-layer circuit boards, and the subsequent process of adding layers can be performed to the two individual multi-layer circuit boards. Therefore, the manufacturing method of the invention is capable of forming two individual multi-layer circuit boards, reducing accumulation of alignment error through layers in conventional multi-layer circuit board, and even reducing layer deviation in the conventional multi-layer circuit board. Furthermore, since the conductive hole of each layer is formed by using the concentric-circle patterns formed in the same photolithography process as the alignment target, the circumstance of producing the conductive hole deviation (or worse yet, incapable of joining the conductive holes together) due to accumulation of alignment error through layers is reduced. Therefore, the invention can indeed improve the alignment accuracy of the multi-layer circuit board and increase the wiring density and capability of the circuit layer. In addition, the design of the conductive holes and the bonding pads on bottom layers can be miniaturized owing to the alignment accuracy. Even the pattern design with the single-side alignment accuracy up to less than 50 μm may be achieved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method for a multi-layer circuit board, comprising:
   compressing two core layers to form a substrate having two surfaces opposite to each other;
   forming a first via connecting through the two surfaces;
   forming a first patterned circuit layer on each of the two surfaces by using the first via as an alignment target, and the first patterned circuit layer including a first concentric-circle pattern surrounding the first via;
   forming a first stacking layer on each of the two surfaces, and the first stacking layer including a first dielectric layer and a first circuit layer covering the first dielectric layer;
   forming a first through hole, and the first through hole penetrating regions where an inner diameter of a first concentric circle from a center of the first concentric-circle pattern is orthogonally projected on the first stacking layers and the substrate;
   forming a second stacking layer on each of the first stacking layers, and the second stacking layer including a second dielectric layer and a second circuit layer covering the second dielectric layer; and
   forming a second through hole, and the second through hole penetrating regions where an inner diameter of a second concentric circle from the center of the first concentric-circle pattern is orthogonally projected on the second stacking layers, the first stacking layers and the substrate.

2. The manufacturing method for the multi-layer circuit board as claimed in claim 1, wherein compressing the two core layers further comprises:
   compressing a bonding material in between the two core layers.

3. The manufacturing method for the multi-layer circuit board as claimed in claim 2, wherein the first via respectively penetrates the substrate and the bonding material.

4. The manufacturing method for the multi-layer circuit board as claimed in claim 2, wherein a material of the bonding material comprises resin.

5. The manufacturing method for the multi-layer circuit board as claimed in claim 1, further comprising:
   after the first through hole is formed, patterning each of the first circuit layers by using the first through hole as an alignment target; and
   after the second through hole is formed, patterning each of the second circuit layers by using the second through hole as an alignment target.

6. The manufacturing method for the multi-layer circuit board as claimed in claim 1, further comprising:
   after the first through hole is formed, forming a first conductive hole on the corresponding first stacking layer by using the first through hole as an alignment target; and
   after the second through hole is formed, forming a second conductive hole on the corresponding second stacking layer by using the second through hole as an alignment target, and each of the second conductive holes connecting the corresponding first conductive hole.

7. The manufacturing method for the multi-layer circuit board as claimed in claim 1, wherein a method of forming the first through hole and the second through hole comprises $CO_2$ laser drilling.

8. The manufacturing method for the multi-layer circuit board as claimed in claim 7, further comprising:
before the first through hole is formed, forming a first opening on the corresponding first circuit layer, and the first opening exposing a region where the first concentric-circle pattern is orthogonally projected on the first dielectric layer; and
before the second through hole is formed, forming a second opening on each of the second circuit layers, and the first opening exposing a region where the first concentric-circle pattern is orthogonally projected on the second dielectric layer.

9. The manufacturing method for the multi-layer circuit board as claimed in claim 7, wherein a method of forming the first through hole comprises simultaneously drilling from outer surfaces of the first stacking layers towards the substrate, and a method of forming the second through hole comprises simultaneously drilling from outer surfaces of the second stacking layers towards the substrate.

10. The manufacturing method for the multi-layer circuit board as claimed in claim 1, wherein a method of forming the first through hole and the second through hole comprises direct laser drilling (DLD).

11. The manufacturing method for the multi-layer circuit board as claimed in claim 10, wherein a method of forming the first through hole comprises simultaneously drilling from outer surfaces of the first stacking layers towards the substrate, and a method of forming the second through hole comprises simultaneously drilling from outer surfaces of the second stacking layers towards the substrate.

12. The manufacturing method for the multi-layer circuit board as claimed in claim 1, further comprising:
after the second through hole is formed, separating the two core layers of the substrate from each other to form two individual multi-layer circuit boards.

13. The manufacturing method for the multi-layer circuit board as claimed in claim 12, wherein the substrate further comprises a second via penetrating the substrate, the first patterned circuit layer further comprises a second concentric-circle pattern surrounding the second via, and the manufacturing method for multi-layer circuit board further comprises:
forming a $M^{th}$ stacking layer on the second stacking layer of one among the two multi-layer circuit boards, and the $M^{th}$ stacking layer comprising a $M^{th}$ dielectric layer and a $M^{th}$ circuit layer covering the $M^{th}$ dielectric layer, wherein M is a positive integer greater than two;
forming a $M^{th}$ through hole, and the $M^{th}$ through hole penetrating regions where an inner diameter of a first concentric circle from the center of the second concentric-circle pattern is orthogonally projected on the first to the $M^{th}$ stacking layers and the core layer;
forming a $(M+1)^{th}$ stacking layer on the $M^{th}$ stacking layers, and the $(M+1)^{th}$ stacking layer including a $(M+1)^{th}$ dielectric layer and a $(M+1)^{th}$ circuit layer covering the $(M+1)^{th}$ dielectric layer; and
forming a $(M+1)^{th}$ through hole, and the $(M+1)^{th}$ through hole penetrating regions where an inner diameter of a second concentric circle from the center of the second concentric-circle pattern is orthogonally projected on the first to the $(M+1)^{th}$ stacking layers and the core layer.

14. The manufacturing method for the multi-layer circuit board as claimed in claim 13, further comprising:
after the $M^{th}$ through hole is formed, patterning the $M^{th}$ circuit layer by using the $M^{th}$ through hole as an alignment target; and
after the $(M+1)^{th}$ through hole is formed, patterning the $(M+1)^{th}$ circuit layer by using the $(M+1)^{th}$ through hole as an alignment target.

15. The manufacturing method for the multi-layer circuit board as claimed in claim 13, further comprising:
after the $M^{th}$ through hole is formed, forming a $M^{th}$ conductive hole on the $M^{th}$ stacking layer by using the $M^{th}$ through hole as an alignment target; and
after the $(M+1)^{th}$ through hole is formed, forming a $(M+1)^{th}$ conductive hole on the $(M+1)^{th}$ stacking layer by using the $(M+1)^{th}$ through hole as an alignment target, and the $(M+1)^{th}$ conductive hole connecting the $M^{th}$ conductive hole.

16. The manufacturing method for the multi-layer circuit board as claimed in claim 13, wherein M is substantially equal to or grater than five.

* * * * *